United States Patent [19]

Mori et al.

[11] Patent Number: 4,553,257
[45] Date of Patent: Nov. 12, 1985

[54] AUTOMATIC SOUND VOLUME CONTROL DEVICE

[75] Inventors: Shuichi Mori; Yasumasa Fukatsu; Takashi Sakakibara, all of Saitama, Japan

[73] Assignee: Pioneer Electronic Corp., Tokyo, Japan

[21] Appl. No.: 489,291

[22] Filed: Apr. 28, 1983

[30] Foreign Application Priority Data

Apr. 28, 1982 [JP] Japan .................................. 57-71908
May 26, 1982 [JP] Japan .................................. 57-90403

[51] Int. Cl.⁴ .............................................. H03G 3/00
[52] U.S. Cl. .................................... 381/57; 381/107
[58] Field of Search ................... 381/57, 56, 71, 72, 381/94, 107

[56] References Cited

U.S. PATENT DOCUMENTS 3,290,442 12/1966 Suganuma .............................. 381/57
3,934,085 1/1976 Munson et al. ........................ 381/57

Primary Examiner—James L. Dwyer
Attorney, Agent, or Firm—Sughrue, Mion, Zinn, Macpeak & Seas

[57] ABSTRACT

An automatic sound volume control device for use in a device such as a radio or tape player used in a high ambient noise environment. The noise and sound signal levels above predetermined reference levels are detected and a control signal is produced having a level determined in accordance with the output signals so produced. The amplification gain of the sound signal is set by this control signal. Several different ways of producing the control signal are described, each of which has particular advantages in different situations and for different types of reproduced sound.

13 Claims, 21 Drawing Figures

AUTOMATIC SOUND VOLUME CONTROL DEVICE

BACKGROUND OF THE INVENTION

The present invention relates to an automatic sound volume control device. More particularly, the invention relates to an automatic sound volume control device which allows a listener to clearly hear reproduced sound at places where the ambient noise level is high.

When music is played in a high ambient noise environment, the music may be masked by the noise. For instance, when music is being played by a stereophonic tape player or radio in a moving automobile, the music may be intermittently masked by the ambient noise as the noise level varies or the music sound level changes.

In order to solve this problem, an automatic sound volume control device which adjusts the output sound level in response to a detected ambient noise level has been proposed. In an example of such a device shown in FIG. 1, the ambient noise is picked up and converted into an electrical signal by a detector 1. This electrical signal is supplied to a noise level detecting circuit 2 which produces a signal representing the level of the noise. The noise level signal thus produced is multiplied by a constant $\alpha$ in a scale factor multiplier circuit 4, which resultingly outputs a gain control signal A.

A desired voice or music signal B applied to a signal input terminal 3 is supplied through a gain control circuit 5 to a power amplifier 6 where it is amplified. The amplified signal is reproduced by a loudspeaker 7. In this operation, the gain control circuit 5 varies the gain in accordance with the gain control signal A outputted by the constant circuit 4. That is, as the ambient noise level increases, the level of the sound reproduced by the loudspeaker 7 is increased so that the listener can easily hear the desired reproduced sound. The relationship between the ambient noise level and sound volume is shown in FIG. 2, from which it can be seen that the average sound volume b is increased as the ambient noise a increases.

In the above-described device, the level of output sound produced is varied according only to the level of the ambient noise. Therefore, the device still suffers from a drawback in that it is not so effective in a case when the input (desired) signal level varies significantly.

For example, for the case of a symphony which has a considerable variation in average sound level, a low level music sound is masked in a range D as shown in FIG. 3A. If the gain is increased in order to prevent the low level signal c from being masked, then a difficulty occurs in that the high level signal e is excessive in sound volume at a range f as shown in FIG. 3B, possibly causing distortion of the signal in the loudspeaker or power amplifier.

Accordingly, an object of the invention is to produce an automatic sound volume control device which is effective even when the input signal level varies.

SUMMARY OF THE INVENTION

In accordance with the above and other objects of the invention, there is provided, in a device for amplifying and reproducing sound signals in the presence of ambient noise, an automatic sound volume control device which includes means for detecting a noise level, means for detecting a sound level (music or voice sound level), means for producing a control signal having a level determined in accordance with the outputs of both of the detecting means, and means for setting an amplification gain of the sound signal in accordance with this control signal. Preferably, the means for detecting the noise and sound levels produces output signals which represent the levels of the noise and sound signals above first and second reference levels, respectively. In one preferred embodiment of the invention, the control signal takes the form of $$\Delta G = \alpha(N-N_0) + \gamma(N-N_0)(S-S_0) + \delta(S-S_0),$$

where N is the ambient noise level, S is the sound level, $N_0$ is the first predetermined reference level, $S_0$ is the second predetermined reference level, and $\alpha$, $\gamma$ and $\delta$ are constants.

The noise and sound signal levels are preferably detected with different time constants, with the time constant utilized for detecting the noise level being larger than that for detecting the sound signal level. In this case, the control signal for controlling the gain of the sound signal takes the form of:

$$\Delta G = \Delta N(\mu + \lambda \Delta S),$$

where $-(1/\Delta N) \leq \lambda \leq 0$, and preferably $-0.04 \leq \lambda \leq 0$.

In yet another embodiment, the control signal is set in accordance with:
(a) $\Delta G = \lambda \cdot \nu$, for $\nu < 0$, and
(b) $\Delta G = 0$, for $\nu \geq 0$,
where $\nu = \Delta S - \beta N - \Delta S_T$, and $\Delta S_T$ is negative constant. In this case, $\mu \geq 0$ and $-1 \leq \lambda < 0$.

BRIEF DESCRIPTION OF THE DRAWINGS

FIGS. 6, 7A, 7B, 12 and 13 are characteristic diagrams related to the embodiments of the invention shown in FIGS. 8 and 9;

DESCRIPTION OF THE PREFERRED EMBODIMENTS

Figure 1:
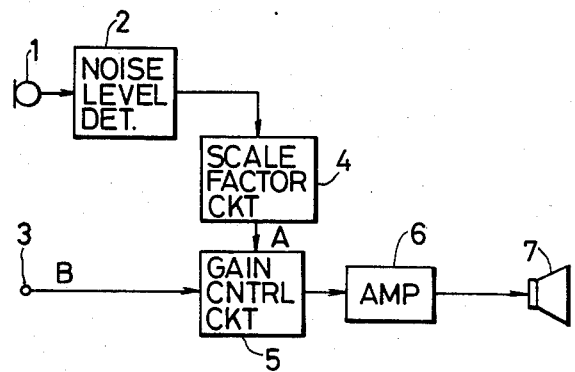
FIG. 1 is a block diagram showing a conventional automatic sound volume control device.
Figure 2:
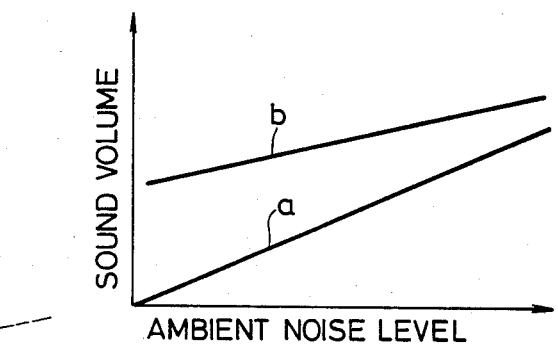
FIG. 2 and FIGS. 3A and 3B are characteristic diagrams related to the device of FIG. 1.
Figure 3A:
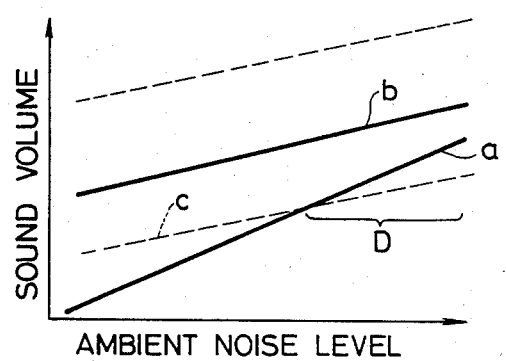
Figure 3B:
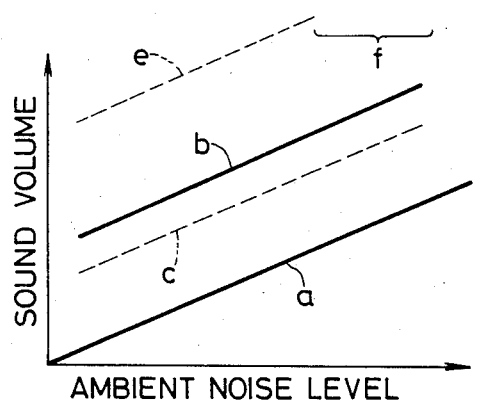
Figure 4:
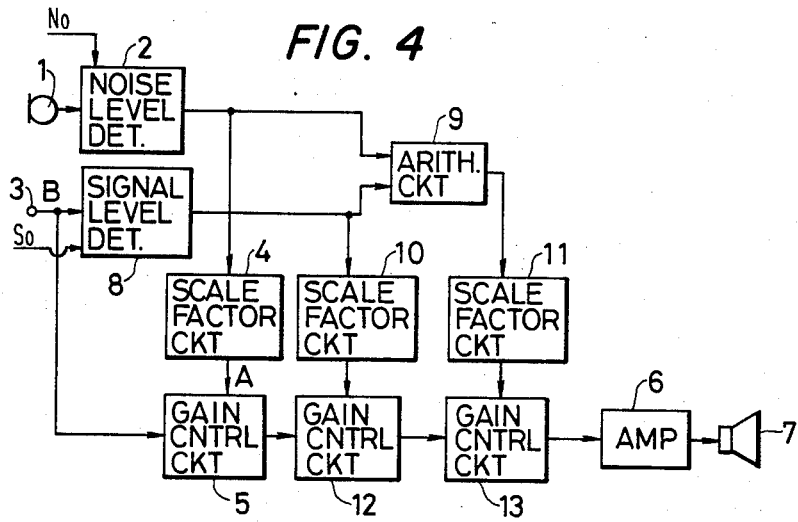
FIG. 4 is a block diagram of a first preferred embodiment of an automatic volume control device of the invention.

A first embodiment of an automatic sound volume control device constructed according to the invention will be described with reference to FIG. 4. In FIG. 4, those components which have been described with reference to FIG. 1 are indicated by like reference numerals.

In FIG. 4, reference numeral 8 designates a signal level detecting circuit for detecting the level of a desired input signal B, 9 an arithmetic circuit which receives the outputs of the noise level detecting circuit 2 and the signal level detecting circuit 8 and subjects them to multiplication, 10 a second scale factor multiplier circuit for multiplying the output of the input signal level detecting circuit by a constant $\beta$, 11 a third scale factor multiplier circuit for multiplying the output of the arithmetic circuit 9 by a constant $\gamma$, and 12 and 13 gain control circuits for varying the level of the signal supplied to the power amplifier in accordance with the output signals from the scale factor multiplier circuits 10 and 11.

Figure 5:
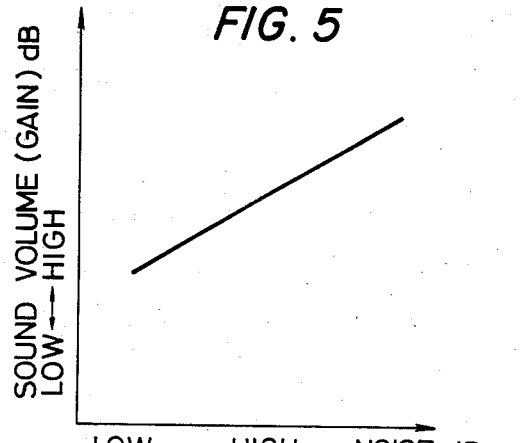
FIGS. 5 and 6 are characteristic diagrams related to the embodiment of FIG. 4.
Figure 6:
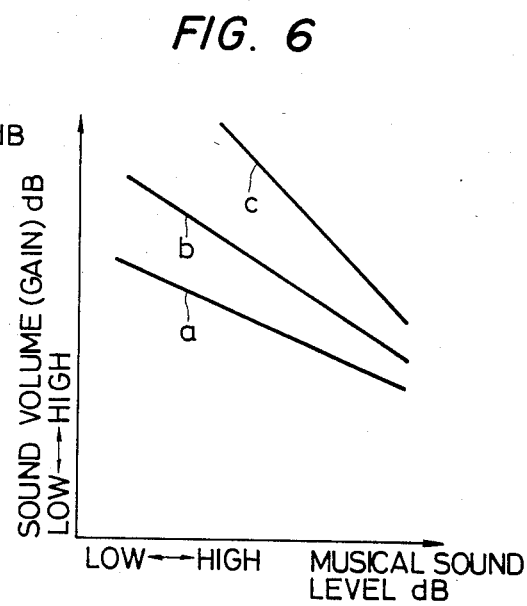

Prior to an explanation of the operation of the above-described device, the relationships between the sound volume (volume control gain) and noise level and between the sound volume and actual music sound level will be described. These relationships are shown in FIGS. 5 and 6, respectively. As shown by FIG. 5, the relationship between noise level (in dB) and the sound volume (gain in dB) needed to provide good audibility for the reproduced sound is substantially linear in the range of noise levels which can ordinarily be expected to occur in a moving automobile. This relationship can be represented by the following expression:

$$\Delta G_1 = \alpha(N - N_0), \quad (1)$$

where $\Delta G_1$ (dB) is the amount of gain variation in the desired sound level which is required to maintain desirable listening conditions when the noise level changes from a reference value $N_0$ (dB) to a value N (dB), and $\alpha$ is the slope of the straight line in FIG. 5.

FIG. 6 indicates the relationship between music sound level (dB) and general sound volume (gain in dB) for predetermined fixed noise levels a, b and c. As in the case of FIG. 5, the relationship is substantially linear for each noise level, although the slope $\beta$ changes with the noise level. The relationship can be expressed by:

$$\Delta G_2 = \beta(S - S_0), \quad (2)$$

where $\Delta G_2$ (dB) is the amount of gain variation which is required to maintain desirable listening conditions when the music level changes from a reference value $S_0$ (dB) to a value S (dB). The slope $\beta$ is thus a function, $$\beta = f(N - N_0), \quad (3)$$

of the noise level.

It has been found experimentally that $\beta$ can be substantially approximated as a function of $(N - N_0)$ by:

$$\beta \simeq \gamma(N - N_0) + \delta. \quad (4)$$

Therefore:

$$\Delta G_2 = \gamma(N - N_0)(S - S_0) + \delta(S - S_0).$$

Thus, in the case where music of a variable level is played in the presence of noise of a variable level, the needed sound volume control variation $\Delta G$ can be represented by:

$$\Delta G = \Delta G_1 + \Delta G_2 = \alpha(N - N_0) + \gamma(N - N_0)(S - S_0) + \delta(S - S_0). \quad (5)$$

Accordingly, in the circuit shown in FIG. 4, the output of the input signal level detecting circuit 8 is supplied to the second scale factor multiplier circuit 10 where it is multiplied by a constant. The output thus produced is applied to the gain control circuit 12. The output of the arithmetic circuit 9 is multiplied by a constant in the scale factor circuit 11 and supplied to the gain control circuit 13 for gain control. By providing appropriate values of scale factors of $\alpha$, $\delta$ and $\gamma$, respectively, with the scale factor multiplier circuits 4, 10 and 11, the expression (5) is satisfied. Thus, even if the ambient noise level or input signal level varies, optimum listening conditions will be maintained at all times.

Figure 7:
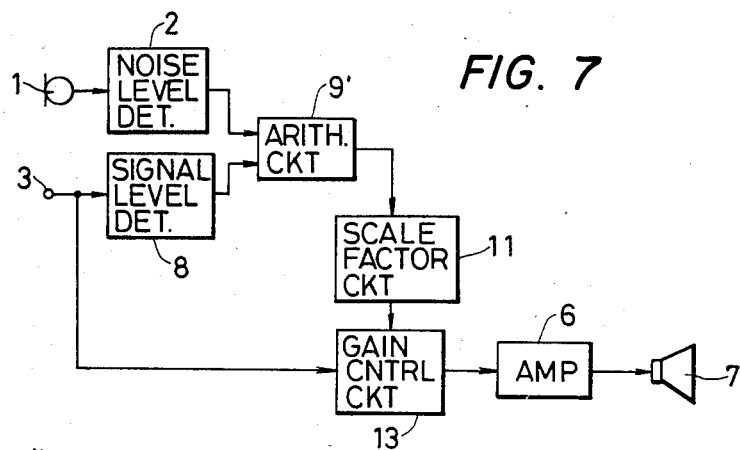
FIG. 7 is a block diagram of a second preferred embodiment of an automatic volume control device of the invention.

If, as indicated in FIG. 7, an arithmetic circuit 9' is so designed that it can directly perform the calculations indicated by expression (5), then the scale factor circuits 4 and 10 and the gain control circuits 5 and 12 can be eliminated.

Figure 8:
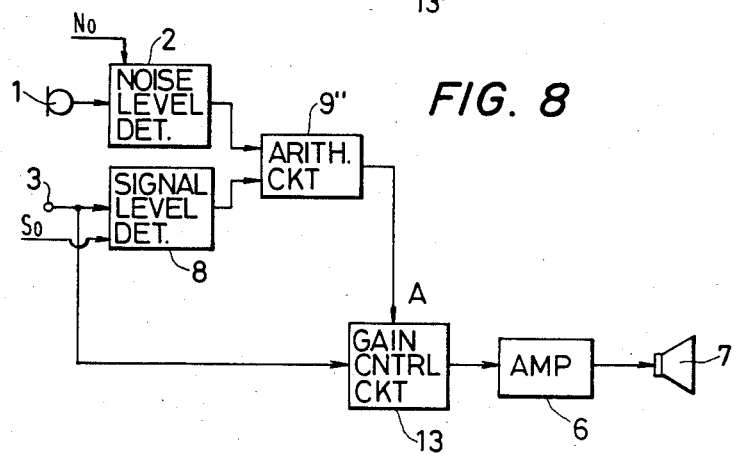
FIG. 8 is a blcok diagram of a third embodiment of an automatic sound volume control device of the invention.

FIG. 8 shows the general arrangement of another embodiment of an automatic sound volume control device of the invention. In FIG. 8, reference numeral 9" indicates an arithmetic and control circuit which provides a gain control signal A for controlling the gain control circuit 13 by subjecting the output signals of the ambient noise level detecting circuit 2 and the input signal level detecting circuit 8 to computation in a manner to be described with reference to FIG. 9.

Figure 9:
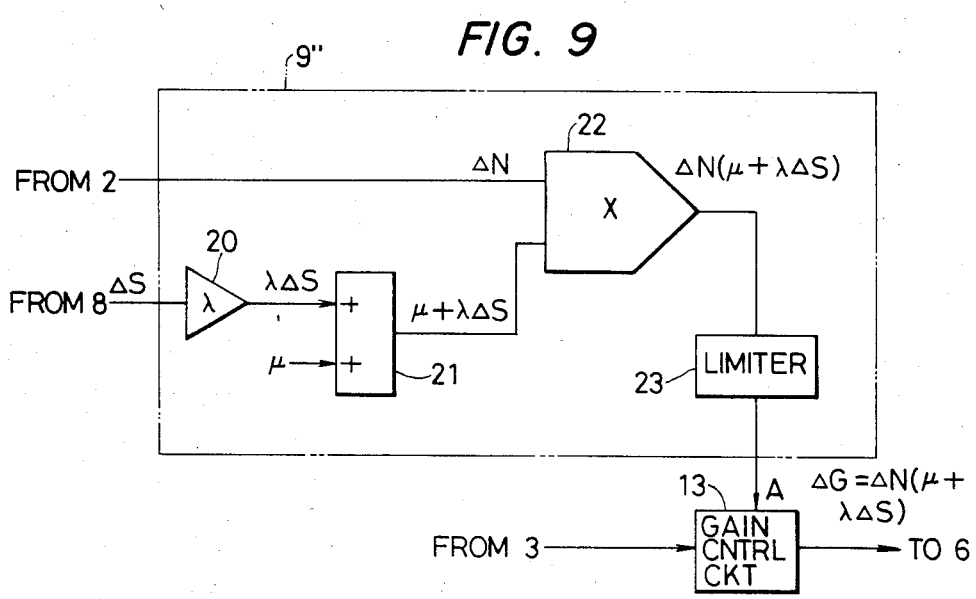
FIG. 9 is a circuit diagram of an arithmetic circuit used in the automatic sound volume control device of FIG. 8.

In FIG. 9, reference numeral 20 designates a scale factor multiplier circuit with which a voltage proportional to the level changes $\Delta S$ (dB) of the input signal supplied from the input signal level detecting circuit 8 with respect to the reference signal level $S_0$ (dB) is multiplied by a constant $\lambda$, 21 an adder circuit for adding a voltage corresponding to a positive constant $\mu$ to the output of the multiplier circuit 20, 22 a multiplier circuit for forming the product of the output of the adder circuit 21 and an output voltage corresponding to a noise level change $\Delta N$ (dB) with respect to a reference noise level $N_0$ (dB(A) SPL) supplied from the noise level detecting circuit 2 with the circuit 22 producing a voltage proportional to $\Delta N(\mu + \lambda \Delta S)$, and 23 designates a limiter circuit.

In the device thus constructed, a DC voltage proportional to the noise level change $\Delta N$ with respect to the reference noise level $N_0$ (dB(A) SPL) is outputted by the noise level detecting circuit 2. In this case, the reference noise level $N_0$ (dB(A) SPL) is selected so as to be the lower limit of the ambient noise level above which sound volume control is required. Generally, it is fixedly or variably set in the range of 40 to 60 (dB(A) SPL). The ambient noise level detecting circuit 2 includes a circuit such as a low-pass filter for separating ambient noise and desired sound signals from one another so that only the ambient noise level is detected.

The level of the input (desired) signal applied to the signal input terminal 3 is detected by the input signal level detecting circuit 8, which ouptputs a DC voltage proportional to an incremental value $\Delta S$ with respect to the reference signal level $S_0$. In this case, it is desirable that the reference signal level $S_0$ (dB) be set to an average value of the expected range of input signal levels. In the case of two channels, the sum of the input signals in the two channels should be detected.

Figure 18:
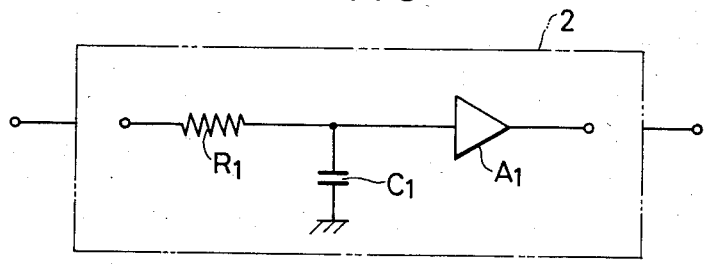
FIG. 18 is a circuit diagram showing an example of a noise level detecting circuit.
Figure 19:
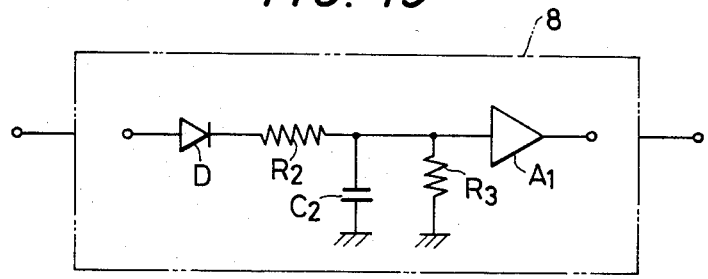
FIG. 19 is a circuit diagram showing an example of a signal level detecting circuit.

Time constant circuits 2' and 8', respectively, of the noise level detecting circuit 2 and the signal level detecting circuit 8 are as shown in FIGS. 18 and 19, respectively. A time constant $\tau_n$ is determined with a resistor $R_1$ and a capacitor $C_1$, a time constant $\tau_r$ is determined with a resistor $R_2$ and a capacitor $C_2$, and a time constant $\tau_f$ is determined with a resistor $R_3$ and a capacitor $C_2$. Reference character D designates a reverse flow preventing diode, and $A_1$ an amplifier. It is desirable in the signal level detecting circuit 8 for the time constant $\tau_f$ for level decrease to be larger than the time constant $\tau_r$ for level increase and for each of these two time constants to be smaller than the time constant $\tau_n$ of the ambient noise level detecting circuit 2. Control is effected such that the gain is increased when the music sound signal is at a low level. Therefore, if the time constant $\tau_r$ is not smaller than $\tau_f$, when the signal level abruptly increases, the signal may be reproduced at too high an output level. Thus, natural reproduced sound can be obtained by making the time constant $\tau_r$ smaller than the time constant $\tau_f$. In general, the level variation of a music sound signal is quicker than that of noise. Therefore, the time constants $\tau_r$ and $\tau_f$ are made smaller than the time constant $\tau_n$ so that abrupt changes in music sound level can be followed.

The output signal of the detecting circuit 8 thus detected is multiplied by a constant negative factor $\lambda$ with the scale factor multiplier circuit 20. The value of the factor $\lambda$ is chosen for determining a signal level compression degree which increases with respect to increases in ambient noise level. The constant is preferably in the range of $-0.04 < \lambda \leq 0$, and may be made selectable by the operator. In the adder circuit 21, a voltage corresponding to the positive factor $\mu$ is added to the output of the multiplier circuit 20. The factor $\mu$ is a constant used for determining a gain increasing rate for a reference level input signal with respect to increases in ambient noise level. This constant is generally in the range of $0 \leq \mu < 1$, and also may be made selectable by the operator.

The multiplier circuit 22 forms the product of the output of the ambient noise level detecting circuit 2 and the output of the adder circuit 21. The output voltage from the multiplier circuit 22 is thus proportioal to $\Delta N(\mu + \lambda \Delta S)$. A two-quadrant multiplier may be employed as the multiplier circuit 22 with the output of the ambient noise level detecting circuit 2 connected to the positive input terminal thereof and the output of the adder circuit 21 connected to the bipolar input terminal. Thus, when the ambient noise level is lower than the reference noise level, that is, when $\Delta N = 0$, sound volume control is carried out with the output of the multiplier circuit being zero.

The output signal of the multiplier circuit 22 thus obtained is applied through the limiter circuit 23, as a gain control signal A, to the gain control circuit 13. The gain control circuit 13 is a variable gain circuit composed of a voltage-controlled amplifier or the like, the gain of which can be logarithmically linearly controlled. Therefore, by matching the control sensitivity with the output voltage characteristic of the multiplier circuit 22, control can be effected in such a manner that the gain $\Delta G$ (dB) for the input signal supplied through the signal input terminal 3 satisfies the following equation:

$$\Delta G = \Delta N(\mu + \lambda \Delta S). \tag{6}$$

Figure 10:
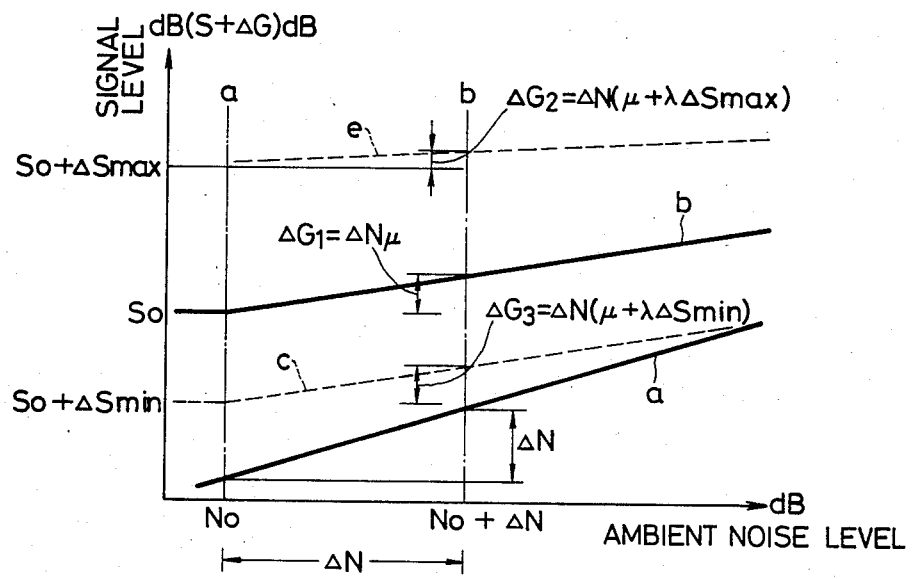

FIG. 10 indicates the sound volume control effect of the above-described device. In FIG. 10, the maximum value of the input signal level is $S_0 + \Delta S_{max}$(dB), and the minimum value is $S_0 + \Delta S_{min}$(dB) ($\Delta S_{max} > 0$, and $\Delta S_{min} < 0$). Further, in FIG. 10, the ordinate axis indicates the sum of an input signal level and gain (in dB) and the abcissa the ambient noise level (in dB). When the ambient noise level is lower than the reference noise level $N_0$ (indicated at a FIG. 10), no sound volume control is carried out, and hence $\Delta G = 0$. As the ambient noise level increases, automatic sound volume control is carried out in accordance with equation (6). For an increment $\Delta N$ (indicated at b in FIG. 10), the gain change $\Delta G_1$ with respect to the average signal level $S_0$ is thus $\Delta N \mu (\Delta G_1 = \Delta N \mu)$. Similarly, a gain increment $\Delta G_2$ for the maximum signal level $S_0 + \Delta S_{max}$ and a gain increment $\Delta G_3$ for the minimum signal level $(S_0 + \Delta S_{min})$ are as follows:

$$\Delta G_2 = N(\mu + \lambda \Delta S_{max}), \text{ and}$$

$$\Delta G_3 = N(\mu + \lambda \Delta S_{min}),$$

where $\Delta N \geq 0$, $\mu \geq 0$, $\lambda \leq 0$, $\Delta S_{max} > 0$ and $\Delta S_{min} < 0$. Therefore, $\Delta G_2 \leq \Delta G_1 \leq \Delta G_3$. In other words, automatic sound volume control is carried in such a manner that, as the signal level decreases, the gain is increased, and as the signal level increases, the gain is decreased. Thus, automatic sound volume control is suitably carried out is such a manner that a low level input signal is not masked by ambient noise and that a high level signal is not reproduced at an excessively high level. In the case where the ambient noise level is sufficient low ($\Delta N \leq 0$), $\Delta G = 0$, and therefore no automatic sound volume control is effected.

The setting of the reference sound volume level during the use of the above-described device and its effect will be described. The term "reference sound volume level" as herein used is intended to mean an average sound volume level which depends on personal taste or choice and which is set by the listener for a low ambient noise level ($\Delta N \leq 0$). In the signal level detecting circuit 8, the level detecting reference value is generally fixed. Therefore, the control effect depends on whether the setting of the reference sound volume is carried out before or after signal level detection.

Figure 11A:
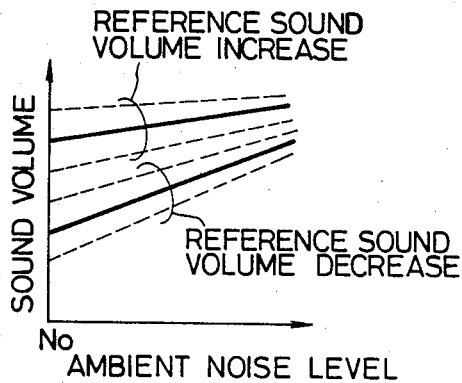
Figure 11B:
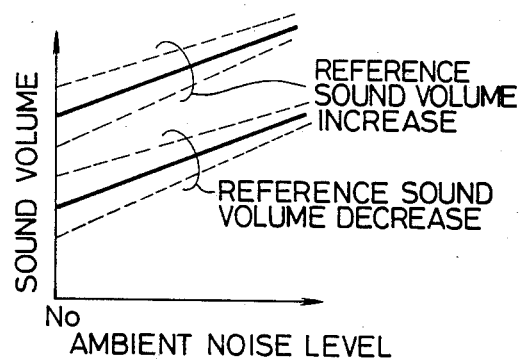

FIG. 11A shows the control effects which are obtained in the case where, when the control constants $\lambda$ and $\mu$ are equal, and the reference sound volume inputted to the terminal 3 is adjusted and set manually by a variable resistor on a tape deck, a tuner or the like. FIG. 11B indicates the control effects which are obtained in the case where the setting of the reference sound volume is carried out in the automatic sound volume control device of the invention or in the rear stage of the device after the signal level has been detected. As shown in FIGS. 11A and 11B, as the reference sound volume increases, the control constant $\mu$ apparently decreases. Generally, the effect of masking by ambient noise decreases as the reference sound volume increases. Therefore, it may be seen that the control method of FIG. 11A is superior in control effect to that of FIG. 11B.

Figure 12:
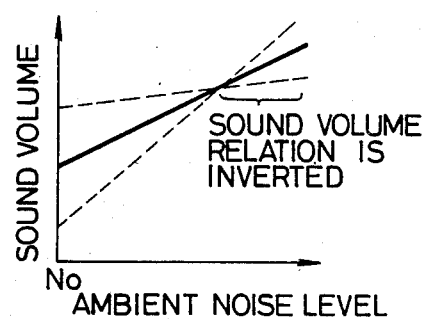

Next, the reasons for selecting the range of the control constant $\lambda$ will be described. With the device, as the ambient noise level increases, the amount of signal level compression is increased, according to the value of the constant $\lambda$, and in the case where $\lambda$ is large and $\Delta N$ is also large, the sound volume relation is inverted as shown in FIG. 12. According to the equation (6) above, the gains for two different signals $\Delta S_1$ and $\Delta S_2$ (where $\Delta S_1 > \Delta S_2$) are as follows:

$$\Delta G_1 = \Delta N(\mu + \lambda \Delta S_1),$$

and $$\Delta G_2 = \Delta N(\mu + \lambda \Delta S_2).$$

The condition for the sound volume relation to be maintained unchanged is:

$$\Delta S_1 + \Delta G_1 \geq \Delta S_2 + \Delta G_2.$$

Accordingly, from these expressions, the range of $\lambda$ is:

$$-(1/\Delta N) \leq \lambda \leq 0.$$

Thus, as $\Delta N$ increases, the $\lambda$ setting range is decreased.

In the example of the device of the invention under discussion, the maximum value of $\Delta N$ is 25 (dB), and hence $-0.04 \leq \lambda \leq 0$.

Figure 13:
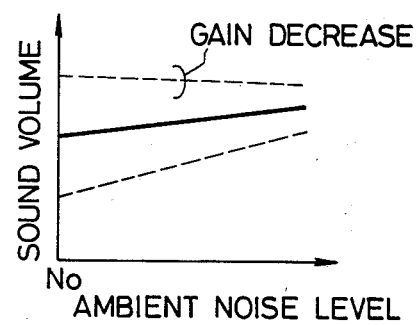

A phenomenon of the ambient noise level increasing while the gain is descreased, and a method of preventing the occurrence of the phenomenon will be described. It is apparent from expression (6) that, when $\mu$ is small and both $\lambda$ and $\Delta S$ are large, sometimes the gain $\Delta G$ can become negative. This is also indicated in FIG. 13. In order to prevent this phenomenon, the automatic sound control device of the invention is provided with a limiter circuit 23 having a nonlinear, diode characteristic, thus preventing $\Delta G$ from becoming negative.

If desired, the limiter circuit 23 may be provided in the input stage of the multiplier circuit 22. That is, the multiplier circuit 22 may be implemented with a first-quadrant multiplier which provides an output only when both inputs are positive.

Figure 14:
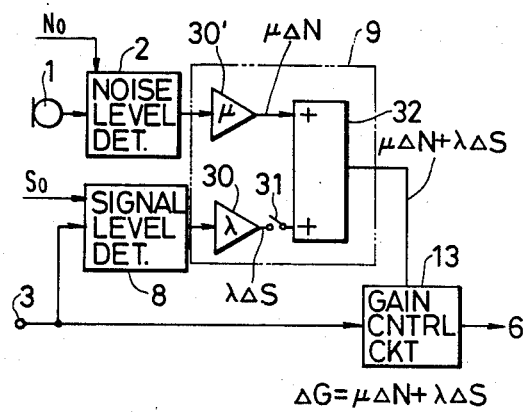
FIG. 14 is a circuit diagram of a fourth embodiment of an automatic gain control device of the invention.

FIG. 14 shows another example of an automatic sound volume control device constructed according to the invention. In the embodiment of FIG. 14, elements corresponding functionally to those already described with reference to FIG. 8 are designated by like reference numerals.

In FIG. 14, reference numeral 30' designates a multiplier circuit with which the output of the ambient noise level detecting circuit 2 is multiplied by the constant $\mu$, and 31 identifies a switch connected to the output terminal of the multiplier circuit 30. In the adder circuit 32 the output of the multiplier circuit 30' is added to the output of the multiplier circuit 30, which is applied through a switch 31 thereto. The output of the adder circuit 32 is applied to the gain control circuit 13.

Figure 15:
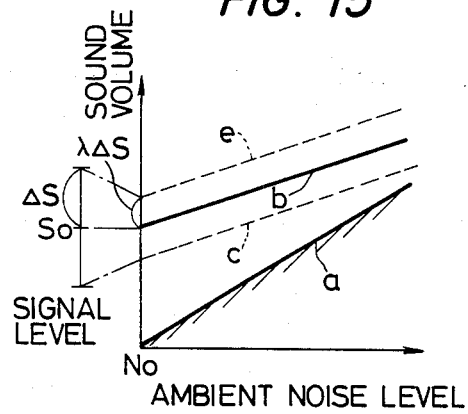
FIG. 15 is a characteristic diagram related to the fourth embodiment of FIG. 14.

In the above-described circuit, the degree of signal compression is constant irrespective of the ambient noise level. Therefore, a control effect as shown graphically in FIG. 15 is obtained by opening the switch 31 for a signal which has a small range of variation and by closing the switch 31 for a signal which has a large range variation. In this connection, the control equations are as follows:

$$\Delta G = \mu \Delta N \text{ (when the switch is open), and}$$

$$\Delta G = \mu \Delta N + \lambda \Delta S \text{ (when the switch is closed),}$$

where $\mu \geq 0$ and $-1 \leq \lambda \leq 0$.

Figure 16:
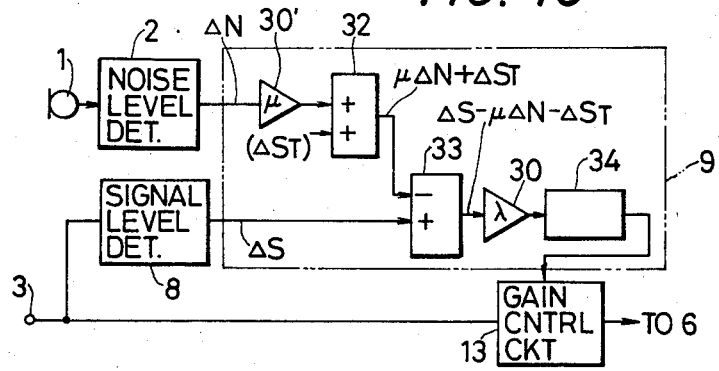
FIG. 16 is a circuit diagram of a fifth embodiment of an automatic sound volume control device of the invention.

FIG. 16 is a circuit diagram showing yet another example of an automatic gain control device of the invention. In FIGS. 16 and 14, like elements are designated by like reference numerals or characters.

In the adder circuit 32, a voltage corresponding to a negative constant $\Delta S_T$ is added to the output of the scale factor multiplier circuit 30'. In a subtractor circuit 33, the output of the adder circuit 32 is subtracted from the output of the signal level detecting circuit 8. The scale factor multiplier circuit 30, which multiplies by $\mu$, is connected to the output terminal of the subtractor circuit 33. The output of the scale factor multiplier circuit 30 is applied to the gain control circuit 13 through the limiter circuit 34.

In the circuit arranged as described above, as the ambient noise increases, the sound volume is increased gradually from a low signal level so that the desired sound output is not masked by the ambient noise. In this case, the control equations are as follows:

(a) $\Delta G = \lambda \cdot \nu$, for $\nu < 0$, and
(b) $\Delta G = 0$, for $\nu \geq 0$, where $\nu = \Delta S - \mu \Delta N - \Delta S_T$.

Figure 17:
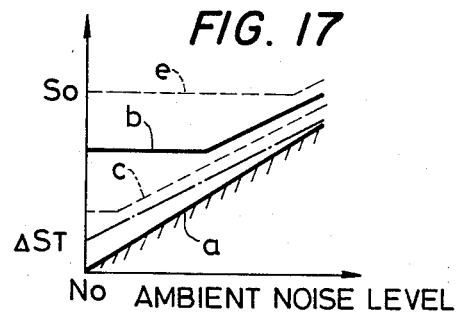
FIG. 17 is a characteristic diagram related to the embodiment of FIG. 16.

The control characteristic is as shown in FIG. 17. In this case, $\mu \geq 0$ and $-1 \leq \lambda < 0$, and hence $\Delta S_T$ is the upper limit for a signal the gain of which is increased when $\Delta N = 0$, with the constant $\Delta S_T$ being either fixed or variable as the case may be.

As is apparent from the above description, the automatic sound volume control device of the invention controls the gain according to both the ambient noise level and the input signal level. Thus, with the device of the invention, when the ambient noise level or input signal level varies, most favorable listening conditions are maintained at all times.

Moreover, according to the invention, gain control is automatically carried out taking into account not only the ambient noise level but also the input signal level. Therefore, a music carrying sound signal having a large range of level variation will not be masked by ambient noise when its level is low, and it will not become excessive in sound volume when its level is high. Thus, sound volume is effectively controlled with the use of the invention.

We claim:

1. In a device for amplifying and reproducing a sound signal in the presence of ambient noise, an automatic sound volume control device having the improvement comprising:
   means for separately detecting a level of said ambient noise relative to a reference noise level;
   means for separately detecting a level of sound signal relative to a reference sound level;
   means for producing a control signal having a level determined in accordance with outputs of both said ambient noise level detecting means and said sound level detecting means;
   means for setting an amplification gain of said sound signal in accordance with said control signal; and
   means for amplifying and reproducing said sound signal in accordance with said gain.

2. The automatic sound volume control device of claim 1, wherein said means for detecting said level of said ambient noise comprises means for producing a first signal representing an increment of said level of said ambient noise above a first predetermined reference level, and wherein said means for detecting said sound level comprises means for producing a second signal representing an increment of said level of said sound signal above a second predetermined reference level.

3. The automatic sound volume control device of claim 2, wherein said means for producing said control signal comprises means for forming as a first product a product of said first signal and a first predetermined constant, and means for forming as a second product a product of said second signal and a second predetermined constant.

4. The automatic sound volume control device of claim 3, wherein said means for producing said control signal further comprises means for forming as a third product a product of said first and second signals and a third predetermined constant.

5. The automatic sound volume control device of claim 3, wherein said first predetermined constant is equal to or larger than zero and equal to or smaller than 1 and said second predetermined constant is equal to or larger than −1 and equal to or smaller than zero.

6. The automatic sound volume control device of claim 3, wherein said means for producing said control signal further comprises means for adding a further predetermined constant with said first and second products.

7. The automatic sound volume control device of claim 3, wherein at least one of said first and second constants is manually adjustable.

8. The automatic sound volume control device of claim 2, wherein said means for producing said control signal comprises means for producing a product of said first signal and a value which is sum of a predetermined positive constant and a product of a predetermined negative constant and said second signal.

9. The automatic sound volume control device of claim 8, wherein the absolute value of said predetermined negative constant is equal to or smaller than the reciprocal of a maximum expected value of said first signal.

10. The automatic sound volume control device of claim 9, wherein said reciprocal is 0.04.

11. The automatic sound volume control device of claim 2, wherein said means for detecting the level of said ambient noise includes a circuit having a first time constant and said means for detecting the level of said sound signal includes a circuit having a second time constant which is smaller than said first time constant.

12. The automatic sound volume control device of claim 3, wherein said means for producing said control signal includes a manually operable switch means which controls said second product.

13. The automatic sound volume control device of claim 2, wherein a level of said sound signal inputted to said means for setting the amplification gain of said sound signal is adjustable in manual operation.

* * * * *